(12) United States Patent
Ramachandran et al.

(10) Patent No.: US 7,333,032 B1
(45) Date of Patent: Feb. 19, 2008

(54) SYSTEM, METHOD AND COMPUTER PROGRAM PRODUCT FOR WORD-LEVEL COMPUTATIONS AND STORAGE

(75) Inventors: Venky Ramachandran, Cupertino, CA (US); Malay Haldar, Noida (IN)

(73) Assignee: Calypto Design Systems, Inc., Santa Clara, CA (US)

( * ) Notice: Subject to any disclaimer, the term of this patent is extended or adjusted under 35 U.S.C. 154(b) by 0 days.

(21) Appl. No.: 11/335,928

(22) Filed: Jan. 20, 2006

(51) Int. Cl.
*H03M 7/00* (2006.01)
(52) U.S. Cl. .......................................... 341/50; 341/51
(58) Field of Classification Search ................ 341/50, 341/51, 106, 87
See application file for complete search history.

(56) References Cited

U.S. PATENT DOCUMENTS

| | | | |
|---|---|---|---|
| 4,591,968 A * | 5/1986 | Nozawa et al. ............. 700/181 |
| 5,585,793 A * | 12/1996 | Antoshenkov et al. ........ 341/51 |
| 5,864,716 A * | 1/1999 | Wishneusky ................. 710/68 |
| 6,032,184 A * | 2/2000 | Cogger et al. ............. 709/223 |
| 6,166,666 A * | 12/2000 | Kadyk ........................ 341/87 |
| 6,522,268 B2 * | 2/2003 | Belu .......................... 341/51 |
| 6,650,261 B2 * | 11/2003 | Nelson et al. ............. 341/106 |
| 6,657,562 B2 * | 12/2003 | Radermacher et al. ........ 341/50 |
| 6,768,818 B2 * | 7/2004 | Friederich et al. .......... 382/233 |
| 6,771,828 B1 * | 8/2004 | Malvar ...................... 382/240 |
| 6,774,827 B2 * | 8/2004 | Pau et al. ................... 341/107 |
| 6,952,825 B1 * | 10/2005 | Cockx et al. ............... 718/102 |
| 2006/0235865 A1 * | 10/2006 | Sperschneider et al. .... 707/101 |

OTHER PUBLICATIONS

U.S. Appl. No. 11/129,238, filed on May 12, 2005.
Office Action from U.S. Appl. No. 11/129,238 mailed on Mar. 21, 2007.

* cited by examiner

*Primary Examiner*—Peguy JeanPierre
(74) *Attorney, Agent, or Firm*—Zilka-Kotab, PC

(57) ABSTRACT

A system, method and computer program product are provided for generating and manipulating a compressed data structure. Initially, a plurality of values associated with an ordered collection of bits is received. It is then determined which of the values are the same. To this end, a compressed data structure including the values is generated, based on the determination.

29 Claims, 4 Drawing Sheets

SYSTEM, METHOD AND COMPUTER PROGRAM PRODUCT FOR WORD-LEVEL COMPUTATIONS AND STORAGE

BACKGROUND AND FIELD OF THE INVENTION

The present invention relates to software applications, and more particularly, to software applications that deal with a plurality of values.

SUMMARY

A system, method and computer program product are provided for generating and operating on a compressed data structure. Initially, a plurality of values associated with an ordered collection of bits is received. It is then determined which of the values are the same, if any. To this end, a compressed data structure including the values is generated, based on the determination. A scheme to perform computations on such a data structure is also described.

DETAILED DESCRIPTION

Figure 1:
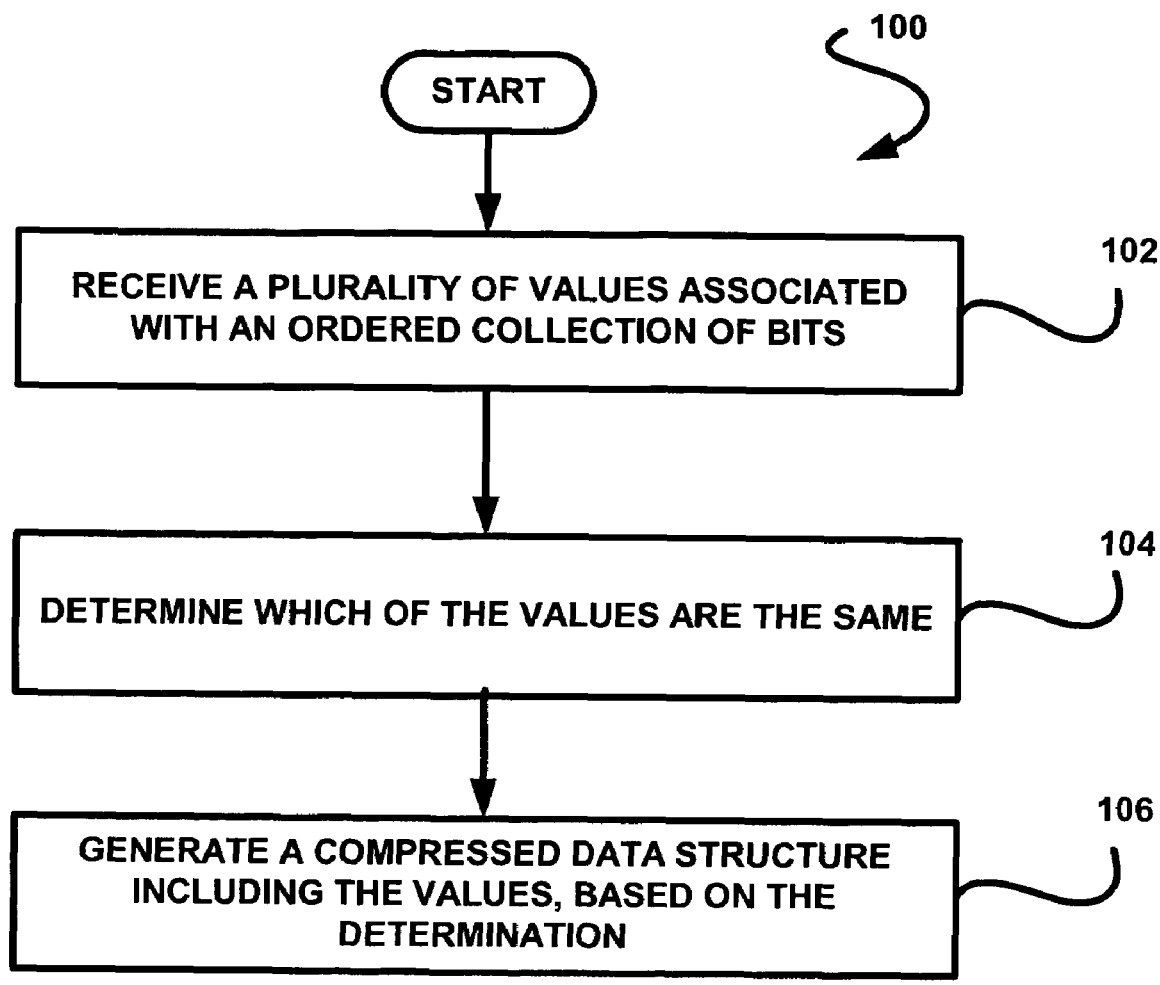
FIG. 1 illustrates a method for generating a compressed data structure, in accordance with one embodiment.

FIG. 1 illustrates a method 100 for generating a compressed data structure, in accordance with one embodiment.

In various embodiments, the compressed data structure may be used in conjunction with any software application that deals with a plurality of values in the context of various design representations (e.g. specification designs, implementation designs, etc.) where it is possible to dynamically reduce/compress a number of groups in a word structure. Just by way of example, the data structure generated by way of method 100 may be used for design performance analysis (e.g. area, power, timing, etc.) with respect to a hardware environment represented by a system level model (SLM) design and/or a register transfer level (RTL) design, where there is a notion of bit vectors and arrays. More information regarding one exemplary analysis technique relevant to SLM and RTL designs may be found with reference to a co-pending application filed May 12, 2005 under application Ser. No. 11/129,238, which is incorporated herein by reference in its entirety for all purposes. Of course, the data structure generated by way of method 100 may be used for any desired purpose.

As shown in FIG. 1, in operation 102, a plurality of values' associated with an ordered collection of bits is received. In one embodiment, the ordered collection of bits may include a word (e.g. a collection of bits of a predetermined size or number, etc.), or any other set or group of bits that are ordered for storing or processing data. Still yet, the values may include numbers, etc. or any other desired data that is capable of being represented by the ordered collection of bits. To this end, each value may be associated with at least one of the bits, a single value may be associated with a plurality of the bits, etc.

In one embodiment, the ordered collection of bits may optionally be associated with an RTL design. For example, the ordered collection of bits may represent a plurality of aspects of a bus. Further, the values may represent a delay associated with each of a plurality of bits of the bus. Similarly, the values may represent a switching activity associated with each of a plurality of bits of the bus.

In another example, the ordered collection of bits may represent a multi-bit instance (i.e. a processing event, operation, etc.). Further, the values may represent a leakage power associated with each bit of the instance. In another aspect of the present embodiment, the ordered collection of bits may further represent a port of the multi-bit instance. In such case, the values may represent arrival times associated with each of a plurality of bits of the port. Similarly, the values may represent required times (i.e. timing requirements, etc.) associated with each of a plurality of bits of the port.

It should be noted that these examples of various entities which may be represented by the ordered collection of bits (and the values associated therewith) are set forth for illustrative purposes only and should not be construed as limiting in any manner. Of course, the ordered set of bits may not necessarily be limited to RTL design or any other specific environment, for that matter.

With continuing reference to FIG. 1, it is next determined which of the values are the same. See operation 104. In one embodiment, such determination may be utilized for identifying unique values (i.e. values that are not the same as others, etc.). Of course, this may be accomplished utilizing any desired algorithm. For example, the values may be simply compared with others, etc. It should be strongly noted that the determination as to which of the values are the same may be accomplished in any desired manner.

To this end, a compressed data structure including the values is generated. Note operation 106. As shown, the compressed data structure may be generated based on the determination of operation 104. For instance, in one embodiment, only the aforementioned unique values may be stored in the compressed data structure, thus requiring less storage space, etc. Table 1 illustrates one exemplary technique for generating a compressed data structure that meets such criteria. Of course, such data structure is set forth for illustrative purposes only and should not be construed as limiting in any manner whatsoever.

TABLE 1

Original bit sequence:
 11222222222222225555555555555555
Compressed data structure:
 (bit range/value)
 b0-b1/1
 b2-b15/2
 b16-b31/5

As is apparent, adjacent bits with the same value may be assigned to the same non-overlapping range set. As an option, such different bit ranges (i.e. "groups") may be defined from left to right, and may further be indexed for look-up purposes. In the context of the present description, a group may refer to a string of bits that are the same. Strictly as an option, the foregoing compression need only be applied to generate the compressed data structure, when the data structure is stored or after any sort of processing.

In some embodiments, especially those involving numerical values, the compressed data structure may include a user-configured or dynamically/automatically-configured amount of the unique values. For example, the compressed data structure may be generated so as to include only a portion of the identified unique values. On the other hand, the compressed data structure may be generated to include all of the identified unique values.

Thus, in various embodiments, an online compression scheme may be provided to identify the unique ordered collections of bits. At one extreme, this allows using only one representative value per word (least accurate but fast and lowest storage). On the other hand, it allows for retaining all unique values (bit accurate but slower and more storage cost). Of course, such compression scheme may allow the accuracy and associated storage cost to be changed as a function of any desired parameter (e.g. the criticality of a local design aspect associated with the corresponding value, globally based on a design state, etc.). The above is a differentiator when compared with traditional schemes of associating only a single value with each design object. In the latter, to accommodate different values, say in timing numbers, one would have to duplicate the design object itself which further adds to the overall memory requirement.

One scheme is described below in Table 2 which resembles a form of single-link clustering.

TABLE 2

Let d_i be the distance between the ith group and the
(i-1)th group [d_0 is defined to be infinity];
While (number of remaining groups > prescribed limit)
    pick the group with minimum d value, say group i, and
    merge it with the group to the left
    Create a new value to represent the combined group
    Update the d values of this group and the group
    immediate to the right
End If the number of initial ordered collection is large, the process can be made efficient by storing the distance values in a mutable priority queue data structure. The present framework itself need not specify the notion of "distance" or the assigned value for combining two ordered collections of bits. These may be customized in any desired way.

In still yet another embodiment, the present framework may use the absolute difference between two values as a measure of distance, and combine two ordered collections by a weighted average. For instance, to combine two ordered collections of size 4 and value 1 with an adjacent ordered collection of size 2 and value 3, the resulting value of the combined ordered collections of size 6 may be: 4*1+2*3/(4+2)=5/3.

More illustrative information will now be set forth regarding various optional features with which the foregoing data structure may or may not be implemented in a hardware SLM-RTL design environment, per the desires of the user. It should be strongly noted that the following information is set forth for illustrative purposes and should not be construed as limiting in any manner. Any of the following features may be optionally incorporated with or without the exclusion of other features described hereinabove.

In various additional embodiments, redundant operations may also be eliminated due to the compressed storage of unique values in a word level data structure. The operations on the word level data structure can be categorized into two groups, namely parallel operations and reduction operations.

Parallel operations on a word level data structure imply operations that are carried out on individual elements of the word level data structure independently of the other elements. Handling of parallel operations on compressed word level data structure can be further categorized by the number of inputs to the operation.

Regarding two input parallel operations, such parallel operations take as input two word level data structures representing words of equal lengths, and apply a particular operation to the unique elements. The produced result is the same result that would have been obtained by performing the operation on expanded versions of the inputs and then compressing the output. An example will now be described given two words, as shown in Table 3.

TABLE 3

< 6, 6, 7, 7, 0, 4, 4, 4 >
whose compressed representation would be (6,7,0,4)
< 1, 1, 0, 0, 0, 3, 1, 1 >
whose compressed representation would be (1,0,3,1)

When addition is performed on the compressed word level data structures, (6,7,0,4) is added to (1,0,3,1) and the result is (7,0,7,5) which is the compressed version of the word <7,7,7,7,0,7,5,5>. The result is obtained by first deducing the bit encoding of the result from the intersection of the bit encodings of the input, and then compressing to come up with the final representation of the output.

Other parallel operations may be performed in the same manner. The intersection of the bit encoding of the two inputs dictate the bit encoding of the output. The unique number of bit encodings in the output is used to perform the operation on the data elements of the input. The result is then compressed to get the final encoding of the output. More details of one way of efficiently computing the bit encodings will be described later.

Operations that are considered two input parallel operations for word level data structure include, but are not limited to addition, subtraction, multiplication, division, modulo operation, Boolean and logical AND, OR, XOR, NOR, and NAND, logical comparisons of equality, inequality, greater than, less than, greater or equal, less or equal, etc.

Regarding single input parallel operations, such parallel operations take as input a single word level data structure. The bit encoding of the output is the same as the bit encoding of the input. The operation is applied to each unique value of the input and the result is used to obtain the output. An example will now be described given a word, as shown in Table 4.

TABLE 4

< 6, 6, 7, 7, 0, 4, 4, 4 >
whose compressed representation would be (6,7,0,4)

When arithmetic inversion is performed on the compressed word level data structure, the result is (−6, −7,0, −4). Only four operations are performed and the output represents the expanded word level data structure of (−6, −6, −7, −7,0, −4, −4, −4).

Operations that are considered single input parallel operation for word level data structure include, but are not limited to arithmetic inversion, logical inversion, absolute value, etc.

Moving on to reduction operations, such operate on a word level data structure by taking as input a single word level data structure and performing an operation on the data elements of that word level data structure to produce a single value. An example will now be described given a word, as shown in Table 5.

TABLE 5

< 6, 6, 7, 7, 0, 4, 4, 4 >
whose compressed representation would be (6,7,0,4)

When the reduction operation minimums is performed on the word, the result is 0. This is obtained by the following steps: minimum(6,7)=6; minimum(6,0)=0; and minimum(0, 4)=0. Hence only three comparisons are performed to find the minimum elements from a word containing eight data elements. The comparisons performed are equal to the number of unique data elements in the word level representation.

In another example, when the reduction operation sum( ) is performed on the word, the result is 38. This is obtained by computing 6*2+7*2+0*1+4*3. The numbers to multiply the data elements are obtained from the bit encoding of the word level representation. As a result, the number of additions performed is equal to the number of unique elements represented in the compressed representation.

Operations that are considered reduction operation for word level data structure include, but are not limited to minimum, maximum, summation, and median.

In addition to the operations listed in the previous section, customized operations can also be performed on the word level data structure. The customized operations may be categorized as parallel or reduction operations.

Given two word level data structures and a customized operation that takes as input two values and is classified as parallel, the customized operation is applied on each value pair obtained from the intersection of the bit level representation of the two input word level data structures.

Given a single word level data structure and a customized operation that takes as input a single value and is classified as parallel, the customized operation is applied on each value of the input word level data structure to produce the output word level data structure.

Given a single word level data structure and a customized operation that takes as input two values, the customized operation is applied to pairs of data elements and then on the results until a single value is obtained.

Figure 2A:
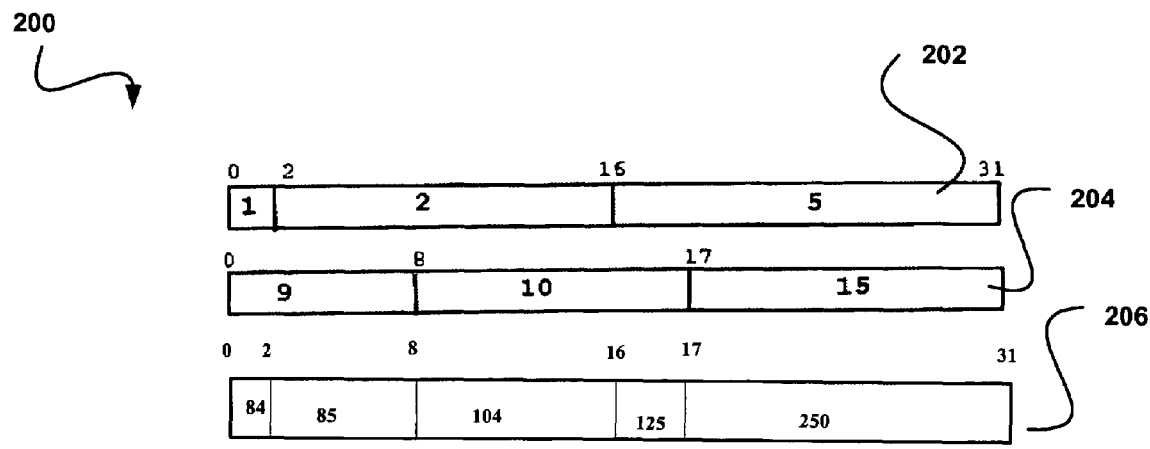
FIG. 2A illustrates an exemplary flow showing the manner in which a compressed data structure may be used to reduce associated arithmetic operations, in accordance with one embodiment.

FIG. 2A illustrates an exemplary flow 200 showing the manner in which a compressed data structure may be used to reduce associated arithmetic operations, in accordance with one embodiment. As an option, the flow 200 may be implemented in the context of the data structure generated by method 100 of FIG. 1. Of course, however, the flow 200 may be carried out in any desired environment. As shown, a pair of data structures is provided including a first word 202 and a second word 204. Again, such words 202, 204 may optionally be generated by way of the method 100 of FIG. 1.

By way of example, consider a parallel operation of squared-addition. This can be implemented by way of a customized function that, given two numbers, first squares each and then sums the results. In the present example, each of the words includes a collection of 32 ordered bits, which would typically require 32 additions and 64 multiplications. However, the present flow 200 utilizes a specialized algorithm for minimizing the number of arithmetic operations and generating a third word 206 shown in FIG. 2A. Table 6 below illustrates such algorithm, at least in part.

TABLE 6

| bit 0-2: | 1*1 + 9*9 = 82 |
| bit 2-8: | 2*2 + 9*9 = 85 |
| bit 8-16: | 2*2 + 10*10 = 104 |
| bit 16-17: | 5*5 + 10*10 = 125 |
| bit 17-31: | 5*5 + 15*15 = 250 |

As shown, the flow 200 leverages the fact that there are only 3 unique values in each word (e.g. values 1, 2, and 5 for the first word 202 and values 9, 10, and 15 for the second word 204, etc.) for providing a significant memory savings (e.g. 11 vs. 96 storage), computational savings (e.g. 15 vs. 96 additions and 10 vs. 64), etc.

Figure 2B:
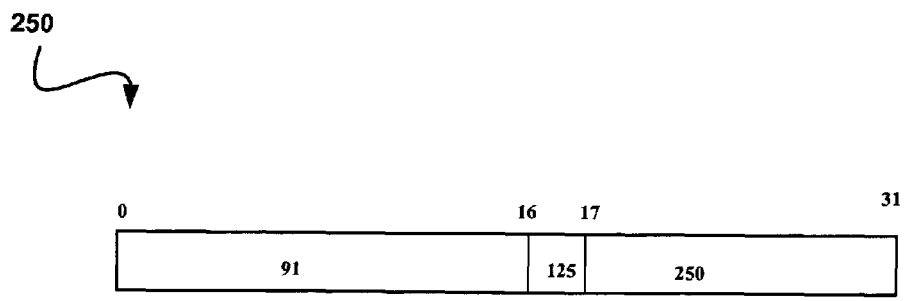
FIG. 2B illustrates an exemplary data structure resulting from the addition operation of FIG. 2A, where a maximum number of 3 values for each word is specified for simplifying an end result.

As a further option, a further simplification may be carried out by specifying a maximum number of values for each word. FIG. 2B illustrates an exemplary data structure 250 resulting from the addition operation of FIG. 2A, where a maximum number of 3 values for each word is specified for simplifying an end result. Such a simplification not only reduces the local memory requirement but also serves to simplify any downstream computations which depend on this value(s).

While a numerical example is set forth in FIGS. 2A and 2B, it should be noted that the present technique may be applied to logical computations as well. For that matter, the present algorithm may be used in the context of any operation required during a RTL performance analysis for calculations involving timing, power, area, etc. In any case, the number of operations involving a plurality of the data structures may be reduced. For example, consider a user function which returns a delay value given a slew (transition time) and a capacitance value as arguments. Internally, it may call other functions such as dlyEqn in the example. See Table 7.

TABLE 7

| time | GetDelayOne__(time sl, cap C) { |
|      | time t; |
|      | t = dlyEqn(sl, C); |
|      | return t; |
|      | } |

To create a word-level equivalent of the above function to use with data structures in accordance with the present optional embodiment, the algorithm first may extract the bit mapping of the word-slew and word-cap values, and then do a bitwise OR of the mappings and generate a new mapping. The number of 'one' in the new mapping then indicates the number of times the GetDelayOne function needs to be invoked. The bit indices of these 'one' bits, in turn, allow us to acquire the appropriate slew and cap values to be passed as arguments. A high level code snippet that exemplifies how a word level delay calculation could be written is shown in Table 8.

TABLE 8 word<time> GetDelay(word<time> sl, word<cap> C) {
   return
      word_do(&GetDelayOne__,sl,C)
}

Figure 3:
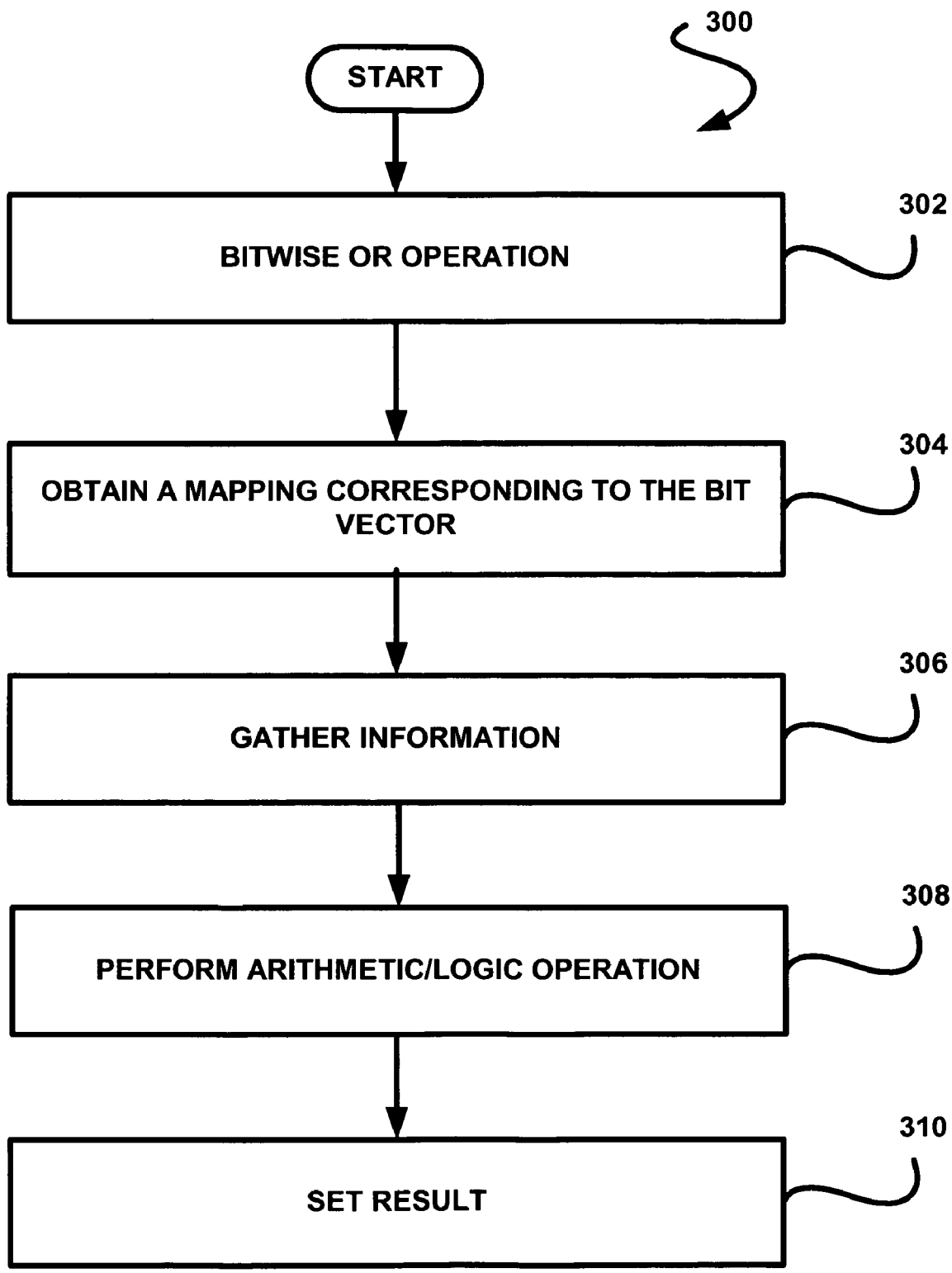
FIG. 3 shows a method illustrating the manner in which an auxiliary data structure mapping may be used to identify groups in association with a plurality of ordered collections of bits ts.

FIG. 3 shows a method 300 illustrating the manner in which an auxiliary data structure mapping may be used to identify groups in association with a plurality of ordered collections of bits. As an option, the method 300 may be implemented in the context of the data structure and associated methods/techniques of FIGS. 1-2B. Of course, however, the method 300 may be carried out in any desired environment.

In one embodiment, the only modification that may be made on an ordered collection of bits is with respect to the value associated with a group. Since the groups are static, in such embodiment, auxiliary data structure mappings may be created to store constant time lookup information for a group associated with a particular bit and a bit range for each group. Note Table 1, for example. Since mappings, if stored in association with each ordered collection of bits, would cause a huge overhead, the cost of the look up may be amortized amongst many ordered collections with the same characteristics (e.g. bit groupings). More information on one example of such a mapping will now be set forth in greater detail.

Each mapping may include a bit vector of a size equal to a size of the ordered collection. Further, each bit of the bit vector may be set to one (1), if it is the first bit of a new group. Thus, the number of 1's in a bit vector is exactly the same as the number of groups.

In use, the bit vector can be used as a hash key (e.g. signature) into a central manager of mappings. Such hash key may be needed to avoid aliasing in the bit vector between two mappings of different sizes and which differ only in the length of the final group. Hence, the size may need to be encoded as well in order to serve as a hash key. A simple scheme may involve adding an extra 1 at the end thereof. Table 9 illustrates an example of such a technique.

TABLE 9

If ordered collection #1 has groups: b0-b3 b4-b7, the bit vector is 1000_1000_0000_0000
If ordered collection #2 has groups: b0-b3, b4-b10, the bit vector is also 1000_1000_0000_0000

Assuming 16-bit precision, it is thus apparent that the two bit vectors have the same signatures even though one represents an 8 bit quantity and the other an 11 bit quantity. Table 10 illustrates modified signatures where a 1 has been introduced at b8 and b11, respectively, making the signatures unique.

TABLE 10

If ordered collection #1 has groups: b0-b3 b4-b7, the bit vector is 1000_1000_1000_0000
If ordered collection #2 has groups: b0-b3, b4-b10, the bit vector is also 1000_1000_0010_0000

In practice, since the leading bit of all bit vectors is always 1, it may be omitted. This, in turn, means that the length of the modified signature may be made equal to the size of the underlying ordered collection of bits.

In order to create a new ordered collection, one scheme may require a client to specify a bit vector describing an intended grouping. A manager module may then perform a look up in the central map repository to find a corresponding mapping using the above-mentioned signature. Of course, a new mapping may be generated if one does not exist.

Similarly, bit vectors can also be created automatically during the course of performing operations involving ordered collections of bits. For example, consider adding two 8-bit ordered with the following ordered collections of Table 11.

TABLE 11 ordered collection: < 2,2,2,2,3,3,3,3> => bit vector: 1000_1000
ordered collection: < 4,4,5,5,5,6,6,6> => bit vector: 1010_0100

Referring specifically to FIG. 3, the method illustrates a technique for finding the grouping implied for the result of the foregoing addition operation. In operation 302, a bitwise OR operation is performed on the two bit vectors. In the example of Table 6, this results in the following: 1010_1100. Next, in operation 304, a mapping corresponding to the bit vector from operation 302 is obtained.

For each group in this mapping (e.g., in our example, 4 groups: b0-b1,b2-b3, b4,b5-b7), information is gathered, as indicated in operation 306. Specifically, a representative bit belonging to the group is obtained, along with the value at a bit specified in the operand.

To this end, the add operation may be applied, in operation 308. Further, the sum may be set as the value for the next group of the resulting ordered collection. Note operation 310. In the example of Table 3, four additions are performed leaving the result of Table 12.

TABLE 12

< 6,6,7,7,8,9,9,9>

As is now apparent, the ordered collection itself stores only the four values (6,7,8,9) along with a pointer to the mapping.

Of course, it should be noted that the aforementioned addition operation above may easily be extended to any arithmetic or logical operation in a similar fashion (e.g., by replacing add with a respective operation, etc.). Indeed, the technique disclosed herein may even be applied to any general two-argument function. Similarly, the technique may even be extended to more than two operands by performing the bitwise OR operation on the bit vectors of all the operands.

In one embodiment of the above word data structure, the values themselves may be stored in an array or a vector data structure. Hence, passing these data structures by value involves the frequent construction and destruction of arrays. This can be eliminated by employing shallow copying semantics when the result of a word operation is transient in nature. In one embodiment, this can be made specific by creating a separate proxy data structure that is similar to the word data structure except that it becomes invalid once it appears on the right hand side of an assignment operation.

In another embodiment, an adaptor model may be provided to view the values held in a word object as a 2-dimensional collection of values. This supports the notion of cross-linking amongst data structures. Such a notion is very useful, but not limited to RTL timing analysis calculations, where an arrival time at a bit of an output port word collection is dependent on all bits of a related input port collection, plus the delay between the two bits.

In yet another embodiment, specific iterator classes may be provided that allows iterating over all bits of a word or over all unique values of a word. Such iterators can be further developed in accordance with interfaces set forth in the Standard Template Library (a commonly available library in C++ available for general software development). This further allows use of the word data structures as set forth in this application with various general algorithms including, but not limited to sorting and searching.

Figure 4:
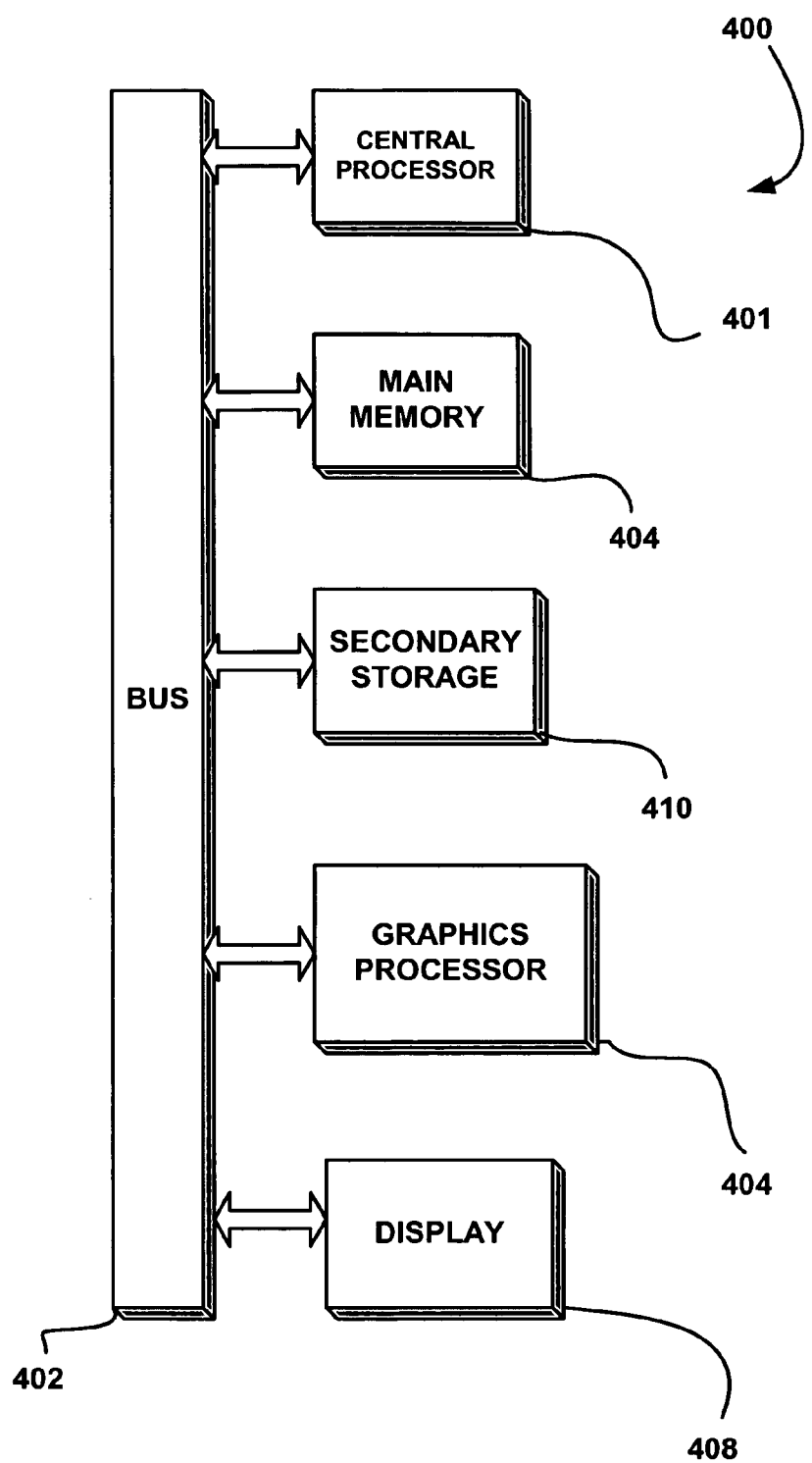
FIG. 4 illustrates an exemplary computer system in which the various architecture and/or functionality of the various previous embodiments may be implemented.

FIG. 4 illustrates an exemplary computer system 400 in which the various architecture and/or functionality of the various previous embodiments may be implemented. As shown, a computer system 400 is provided including at least one host processor 401 which is connected to a communication bus 402. The computer system 400 also includes a main memory 404. Control logic (software) and data are stored in the main memory 404 which may take the form of random access memory (RAM).

The computer system 400 also includes a graphics processor 406 and a display 408, i.e. a computer monitor. The computer system 400 may also include a secondary storage 410. The secondary storage 410 includes, for example, a hard disk drive and/or a removable storage drive, representing a floppy disk drive, a magnetic tape drive, a compact disk drive, etc. The removable storage drive reads from and/or writes to a removable storage unit in a well known manner.

Computer programs, or computer control logic algorithms, may be stored in the main memory 404 and/or the secondary storage 410. Such computer programs, when executed, enable the computer system 400 to perform various functions. Memory 404, storage 410 and/or any other storage are possible examples of computer-readable media.

In one embodiment, such computer programs may be used to carry out the functionality of the previous figures. Further, in other embodiments, the architecture and/or functionality of the various previous figures may be implemented in the context of the host processor 401, a chipset (i.e. a group of integrated circuits designed to work and sold as a unit for performing related functions, etc.), and/or any other integrated circuit for that matter.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

The invention claimed is:

1. A method, comprising:
    receiving a plurality of values associated with an ordered collection of bits;
    determining which of the values are the same;
    generating a compressed data structure including the values, based on the determination; and
    generating a plurality of resulting values based on one or more arithmetic or logical operations performed on the plurality of values associated with the ordered collection of bits;
    wherein the ordered collection of bits is associated with a register transfer level (RTL) design.

2. The method of claim 1, wherein the ordered collection of bits includes a word.

3. The method of claim 1, wherein each value is associated with at least one of the bits.

4. The method of claim 1, wherein a single value is associated with a plurality of the bits.

5. The method of claim 1, wherein the ordered collection of bits represents a plurality of aspects of a bus.

6. The method of claim 5, wherein the values represent a delay associated with each of a plurality of bits of the bus.

7. The method of claim 5, wherein the values represent a switching activity associated with each of a plurality of bits of the bus.

8. The method of claim 1, wherein the ordered collection of bits represents a multi-bit instance.

9. The method of claim 8, wherein the values represent a leakage power associated with the instance.

10. The method of claim 8, wherein the ordered collection of bits further represents a port of the multi-bit instance.

11. The method of claim 10, wherein the values represent arrival times associated with each of a plurality of bits of the port.

12. The method of claim 10, wherein the values represent required times associated with each of a plurality of bits of the port.

13. The method of claim 1, wherein the determination is utilized for identifying unique values.

14. The method of claim 13, wherein only the unique values are stored in the compressed data structure.

15. The method of claim 14, wherein the compressed data structure includes only a portion of the identified unique values.

16. The method of claim 14, wherein the compressed data structure includes all of the identified unique values.

17. The method of claim 14, wherein the compressed data structure includes a user-configured amount of the unique values.

18. The method of claim 1, and further comprising reducing a number of arithmetic or logical operations involving a plurality of the data structures.

19. The method of claim 1, and further comprising reducing a number of user specified functions involving a plurality of the data structures.

20. The method of claim 1, and further comprising generating a mapping for identifying groups in association with the ordered collections of bits.

21. The method of claim 1, wherein one of a mathematical and a logical operation is performed on a plurality of compressed data structures to produce a single compressed data structure result.

22. The method of claim 1, wherein the resulting values include first resulting values, and second resulting values are generated based on a second arithmetic or logical operation performed on the first resulting values.

23. A computer program product embodied on a computer readable medium, comprising:
    computer code for receiving a plurality of values associated with an ordered collection of bits;
    computer code for determining which of the values are the same;
    computer code for generating a compressed data structure including the values, based on the determination; and
    computer code for generating a plurality of resulting values based on one or more arithmetic or logical operations performed on the plurality of values associated with the ordered collection of bits;
    wherein the ordered collection of bits is associated with a register transfer level (RTL) design.

24. A data structure system embodied on a computer readable medium, comprising:
    a compressed data structure including a plurality of values associated with an ordered collection of bits which are compressed based on a determination as to which the values are the same;

wherein a plurality of resulting values are generated based on one or more arithmetic or logical operations performed on the plurality of values associated with the ordered collection of bits;

wherein the ordered collection of bits is associated with a register transfer level (RTL) design.

25. A method, comprising:

receiving a plurality of input values associated with an ordered collection of bits; and generating a plurality of resulting values based on one or more arithmetic or logical operations performed on the plurality of input values;

wherein the ordered collection of bits is associated with a register transfer level (RTL) design.

26. The method of claim 25, wherein only unique values in the plurality of resulting values are included in a compressed data structure, and a mapping is created for identifying groups in association with the ordered collection of bits.

27. The method of claim 26, wherein the compressed data structure includes a user-configured amount of the unique values.

28. The method of claim 25, wherein a single group is mapped to a plurality of ordered collections of bits.

29. The method of claim 25, and further comprising reducing a number of the arithmetic or logical operations by utilizing compressed data structures associated with the input values.

* * * * *

UNITED STATES PATENT AND TRADEMARK OFFICE
CERTIFICATE OF CORRECTION

PATENT NO. : 7,333,032 B1
APPLICATION NO. : 11/335928
DATED : February 19, 2008
INVENTOR(S) : Ramachandran et al.

Page 1 of 1

It is certified that error appears in the above-identified patent and that said Letters Patent is hereby corrected as shown below:

On the Title Page Item (54), please insert --NUMERICAL-- before "COMPUTATIONS" and after "WORLD-LEVEL".

Column 1, lines 2-3, please insert --NUMERICAL-- before "COMPUTATIONS" and after "WORLD-LEVEL".

Signed and Sealed this
Tenth Day of May, 2011

David J. Kappos
*Director of the United States Patent and Trademark Office*